(12) United States Patent
Liu et al.

(10) Patent No.: US 9,570,315 B2
(45) Date of Patent: Feb. 14, 2017

(54) METHOD OF INTERFACIAL OXIDE LAYER FORMATION IN SEMICONDUCTOR DEVICE

(71) Applicant: UNITED MICROELECTRONICS CORPORATION, Hsinchu (TW)

(72) Inventors: Chueh-Yang Liu, Tainan (TW); Yi-Liang Ye, Kaohsiung (TW); Ted Ming-Lang Guo, Tainan (TW); Yu-Ren Wang, Tainan (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 99 days.

(21) Appl. No.: 14/662,142

(22) Filed: Mar. 18, 2015

(65) Prior Publication Data

US 2016/0276165 A1 Sep. 22, 2016

(51) Int. Cl.
*H01L 21/311* (2006.01)
*H01L 21/02* (2006.01)

(52) U.S. Cl.
CPC ...... *H01L 21/31111* (2013.01); *H01L 21/0206* (2013.01); *H01L 21/02238* (2013.01)

(58) Field of Classification Search
CPC ... H01L 21/311; H01L 21/02; H01L 21/31111; H01L 21/0206; H01L 21/31144
See application file for complete search history.

(56) References Cited

U.S. PATENT DOCUMENTS

| 8,722,485 B1 | 5/2014 | Tong | |
|---|---|---|---|
| 2007/0138563 A1 | 6/2007 | Callegari | |
| 2009/0280597 A1* | 11/2009 | Wijekoon | H01L 21/30608 438/71 |
| 2013/0017678 A1* | 1/2013 | Tsai | H01L 21/28088 438/591 |
| 2013/0203230 A1 | 8/2013 | Chen | |
| 2015/0000704 A1 | 1/2015 | Yeh | |

* cited by examiner

*Primary Examiner* — Selim Ahmed
(74) *Attorney, Agent, or Firm* — Ding Yu Tan (57) ABSTRACT

A method of an interfacial oxide layer formation comprises a plurality of steps. The step (S1) is to remove a native oxide layer from a surface of a substrate; the step (S2) is to form an oxide layer on a surface of a substrate by piranha solution (SPM); the step (S3) is to cleaning a surface of the oxide layer by standard clean 1 (SC1), and the step (S4) is to etch he oxide layer by a solution comprising diluted hydrogen fluoride (dHF) and ozonized pure water (DIO3).

18 Claims, 6 Drawing Sheets

METHOD OF INTERFACIAL OXIDE LAYER FORMATION IN SEMICONDUCTOR DEVICE

FIELD OF THE INVENTION

The present invention is related to a manufacturing method for an interfacial oxide layer in a semiconductor device, especially to lower the thickness of an interfacial oxide layer without damage to the substrate underlying.

BACKGROUND OF THE INVENTION

A gate dielectric or an interfacial oxide layer is a very sensitive component of a semiconductor device, and requirements of appropriate dielectric layers include high dielectric breakdown strength, low leakage current, good diffusion barrier properties, low trapping densities and low interfacial states. As device dimensions decrease, the requirements become more stringent and a lower thickness of an interfacial oxide layer is needed to meet the more stringent requirements.

In the conventional chemical oxidation process performed for formation of an interfacial oxide layer, solution containing ozone is commonly used. However, ozone solution always saturates at about 7 angstroms and the interfacial oxide layer encounters a difficulty that the thickness of the interfacial oxide layer cannot be produced below 7 angstroms by chemical oxidation alone. Thus an etching process is necessary to be performed following the chemical oxidation process.

Cleaning solution of Standard Clean 1 (hereinafter SC1 solution) is conventionally used for cleaning or light etching oxide of a surface of a semiconductor element. However, even SC1 solution has a low etching rate to most semiconductor manufacturing materials; it is still difficult to reach desired thickness of the interfacial oxide layer by controlling time of processing. Thus, mixture containing ozone and SC1 solution is then to be used for growing and etching back oxide for better control of thickness (self-saturated etching process) instead of only using SC1 solution.

The inventor has found that ammonium contained in SC1 solution is able to penetrate through the interfacial oxide layer during processing, damage silicon surface underneath the interfacial oxide layer and increase roughness of the silicon surface, and the product with bad negative-bias temperature instability (NBTI) is produced. Yet, the process of etching back has to be performed after formation of the interfacial oxide layer in order to produce an interfacial oxide layer with lower thickness due to a market trend of miniaturization, otherwise an interfacial oxide layers is not able to be lower than 7 angstroms in thickness and the device encounters a situation of high performance without alternation of small sizes.

Accordingly, it is needed to provide a method to thin down the interfacial oxide layer for achieving market trend miniaturization without reduction in performance of the devices. The inventor of the present invention based on years of experience on related research and development has invented a method of interfacial oxide layer formation to improve yields, performance and stability of product performance, and most importantly, thin down the interfacial oxide layer without causing defect to the substrate surface.

SUMMARY OF THE INVENTION

In accordance with an aspect, the present invention provides a method of an interfacial oxide layer formation comprising a plurality of steps. The step (S1) is to remove a native oxide layer from a surface of a substrate; the step (S2) is to form an oxide layer on a surface of a substrate by piranha solution (sulfuric peroxide mixture, also called SPM or SPM solution in short); the step (S3) is to cleaning a surface of the oxide layer by standard clean 1 (SC1); and the step (S4) is to etch he oxide layer by a solution comprising diluted hydrogen fluoride (dHF) and ozonized pure water (DIO3).

In one embodiment of the present invention, a ratio of diluted hydrogen fluoride (dHF) and ozonized pure water (DIO3) in the step (S4) is 1:5.

In one embodiment of the present invention, a concentration of ozonized pure water (DIO3) in the step (S4) is in a range of 2-50 ppm.

In one embodiment of the present invention, a process time for the step (S4) is in a range of 5-120 seconds.

In one embodiment of the present invention, a thickness of the interfacial oxide layer after the step (S4) is thinner than a thickness of the interfacial oxide layer after the step (S3) by 1.0-3.5 angstroms.

In one embodiment of the present invention, a thickness of the interfacial oxide layer after the step (S4) is 3.5-6 angstroms.

In one embodiment of the present invention, a difference of thicknesses of the interfacial oxide layer after the step (S4) within an entire surface area of the substrate is within 0.5 angstroms.

Accordingly, the present invention provides a method of interfacial oxide layer formation that can thin down thickness of the oxide layer for market trend of miniaturization without defect to the substrate surface and thus to improve yields, performance and stability of products.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention is described more specifically with reference to the following embodiments. It is to be noted that the following descriptions of preferred embodiments of this invention are presented herein for purpose of illustration and description only but not intended to be exhaustive or to be limited to the precise form disclosed.

Figure 1:
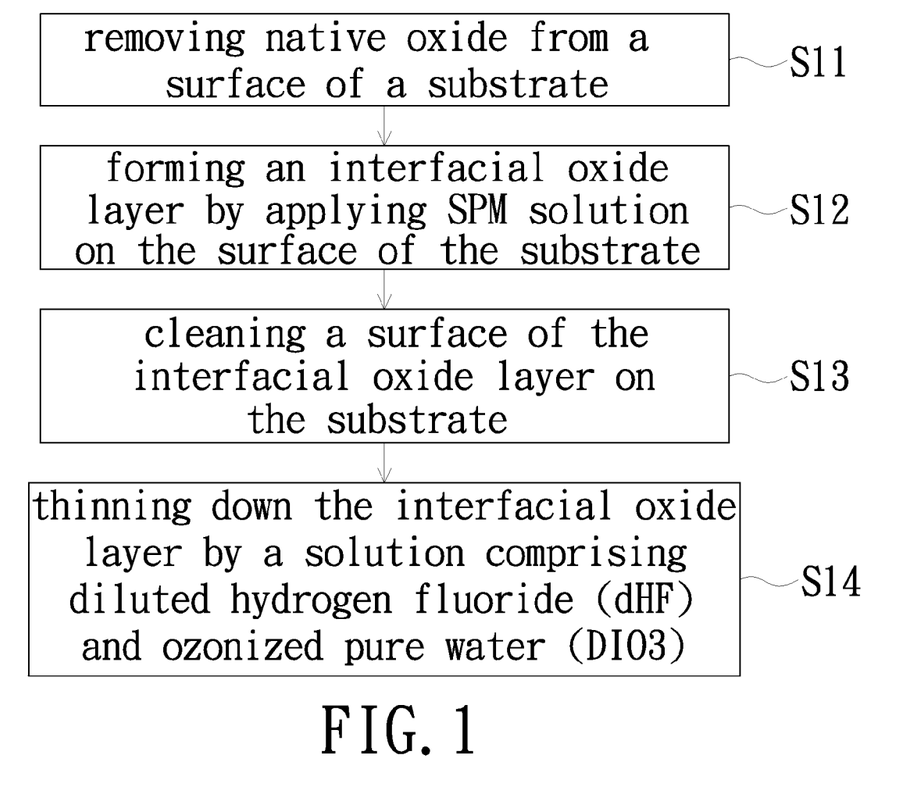
FIG. 1 is a flow chart illustrating a method of an interfacial oxide layer formation in a semiconductor device provided by an embodiment of the present invention.

The present invention provides a method of an interfacial oxide layer formation in a semiconductor device for better control of thickness and better surface smoothness and stability of the interfacial oxide layer, and better performance and reliability of the product. As shown in FIG. 1 schematically illustrating steps of an interfacial oxide layer formation method provided by an embodiment of the present invention, the method comprises following steps: step (S11), removing native oxide from a surface of a substrate; step (S12), forming an interfacial oxide layer by applying sulfuric peroxide mixture (also known as Piranha solution, hereinafter called SPM solution) on the surface of the substrate; step (S13), cleaning a surface of the interfacial oxide layer on the substrate; and step (S14), thinning down the interfacial oxide layer by a solution comprising diluted hydrogen fluoride (dHF) and ozonized pure water (DIO3).

The step (S11) is performed before a chemical oxidation process is applied to the surface of the substrate in order to remove native oxide which may be formed on the surface of the substrate when contacting with atmosphere. The step (S11) is performed under room temperature to ensure the surface of the substrate is clear from possible presence of native oxide, and is smooth without roughness. The solution used for the step (S11) can be diluted hydrogen fluoride (dHF) or other chemicals which can remove oxide without causing damage to the surface of the substrate, and time duration for the step (S11) can be about 8-12 seconds. Then, the step (S12) is performed to form the interfacial oxide layer using chemical oxidation process by applying SPM solution on the surface of the clear substrate for 50-70 seconds under room temperature. Then as shown in step (S13) of FIG. 1, after formation of the interfacial oxide layer, the surface of the interfacial oxide layer is cleaned by cleaning chemicals, such as SC1 solution, under temperatures below 200 degree C. in order to remove tiny particles possibly attached on the surface of the interfacial oxide layer. The step (S14) is then performed to thin down the thickness of the interfacial oxide layer by using self-saturated wet etching method, and the solution used in the step (S14) comprises diluted hydrogen fluoride (dHF) and ozonized pure water (DIO3). The aforementioned solution has a ratio of ozonized pure water (DIO3) to diluted hydrogen fluoride (dHF) within a range of 1:1-5:1, and concentration of ozonized pure water (DIO3) is in a range of 2-50 ppm. The step (S14) is performed in a time duration ranging between 5 seconds and 120 seconds in order to etch back the interfacial oxide layer for about 1.0-3.5 angstroms. The interfacial oxide layer after the step (S14) usually can have a thickness in a range of 3.5-6.0 angstroms, and difference of thickness of the interfacial oxide layer within the entire surface area of the substrate can be controlled in 0.5 angstroms; however, the thickness and difference of thickness of the interfacial oxide layer is truly depends on different cases.

From the above discussion, the interfacial oxide layer is formed partially by SPM solution of the step (S12) and partially by ozonized pure water (DIO3) of the step (S14). And the step (S14) can not only make the interfacial oxide layer reaches the desired thickness but also solve the problem of substrate surface roughness and instability as faced by conventional method. On the other hand, due to ozonized pure water (DIO3) is hydrophilic, the etching solution provided by the present invention can avoid hydrophobic surface of the interfacial oxide layer and so as to avoid particles easily attached on the surface of the interfacial oxide layer that negatively affects performances of products. Therefore, the present invention provides a method of interfacial oxide layer formation without damage to the substrate underlying or formation of hydrophobic surface that may easily attach particles and negatively influence performance of products, and able to achieve better surface smoothness of the interfacial oxide layer. Moreover, the etching solution of the present invention is optionally comprises carbon dioxide ($CO_2$) for avoiding electric charge accumulation on the surface of the interfacial oxide layer.

Figure 2:
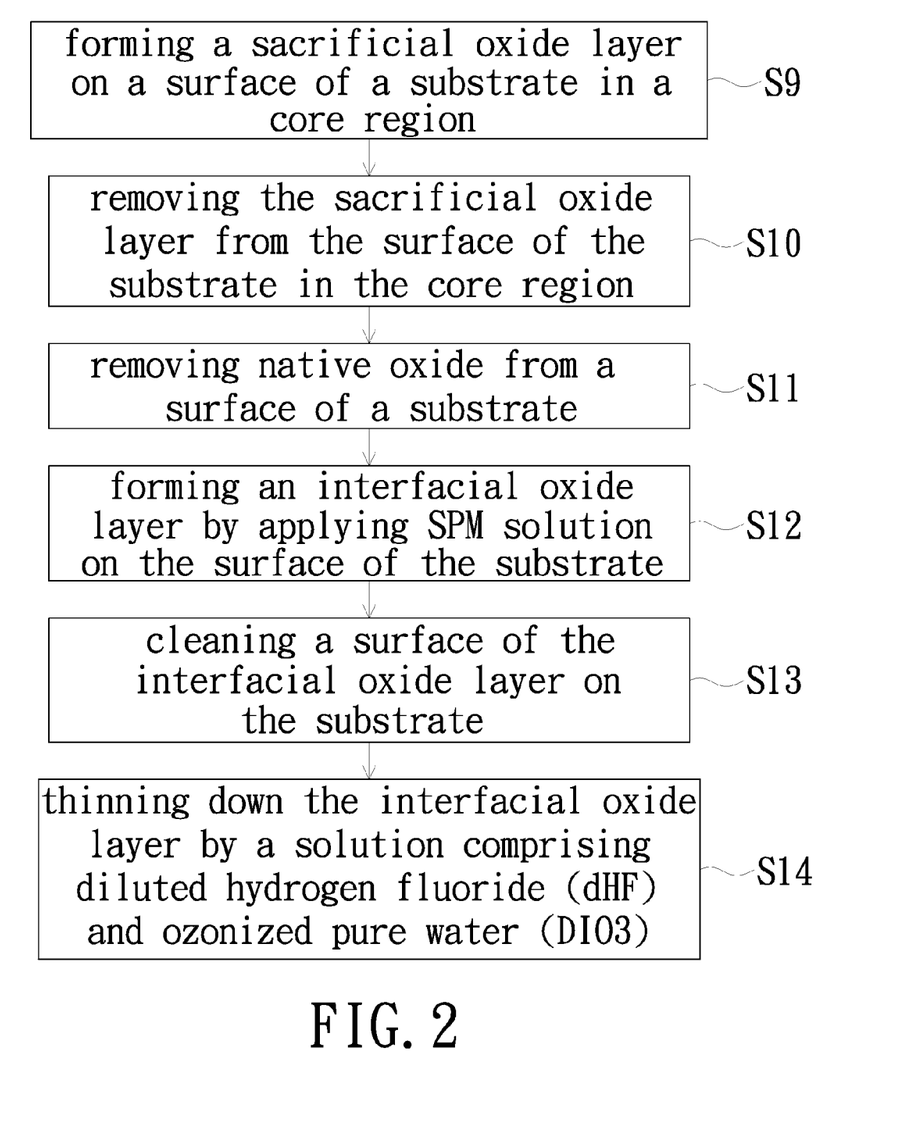
FIG. 2 is a flow chart illustrating a method of an interfacial oxide layer formation in a programmable logic array (PLA) device provided by another embodiment of the present invention.

The above described steps can be applied directly into a conventional metal-oxide-semiconductor field-effect transistor (MOSFET) manufacturing process or a fin-shaped field effect transistor (finFET) manufacturing process, and is then followed by high-k growth deposition process. FIG. 2 schematically illustrates steps of interfacial oxide layer formation of a programmable logic array device according to another embodiment of present invention, and FIGS. 3a-3d are cross sectional illustrations of a portion of the programmable logic array (PLA) device according to FIG. 2.

Figure 3A:
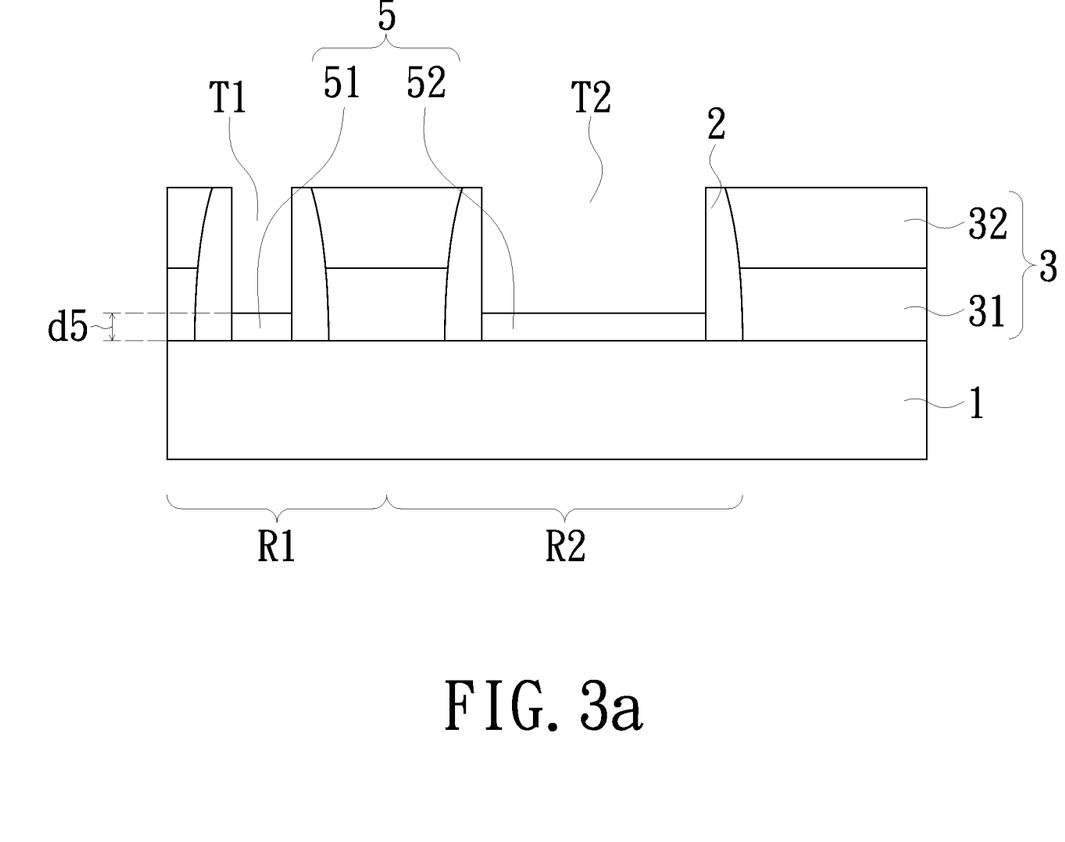
FIGS. 3a-3d schematically illustrates an interfacial oxide layer formation of a portion of the programmable logic array (PLA) device according to the method of FIG. 2.
Figure 3B:
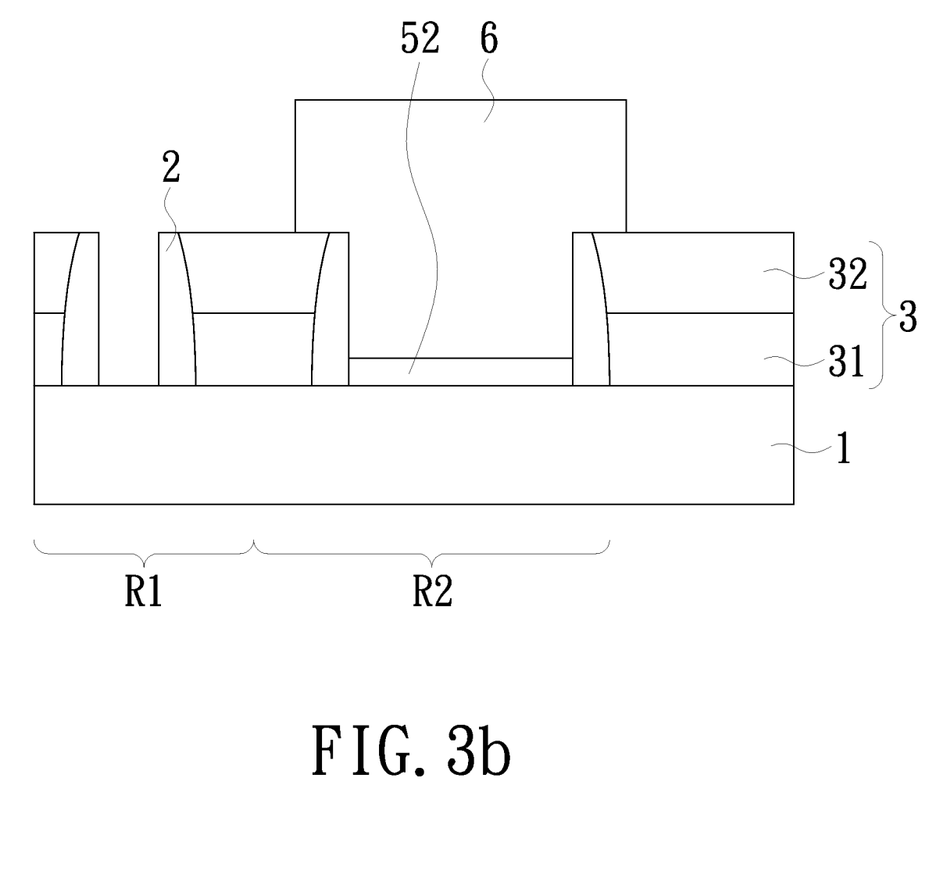
Figure 3C:
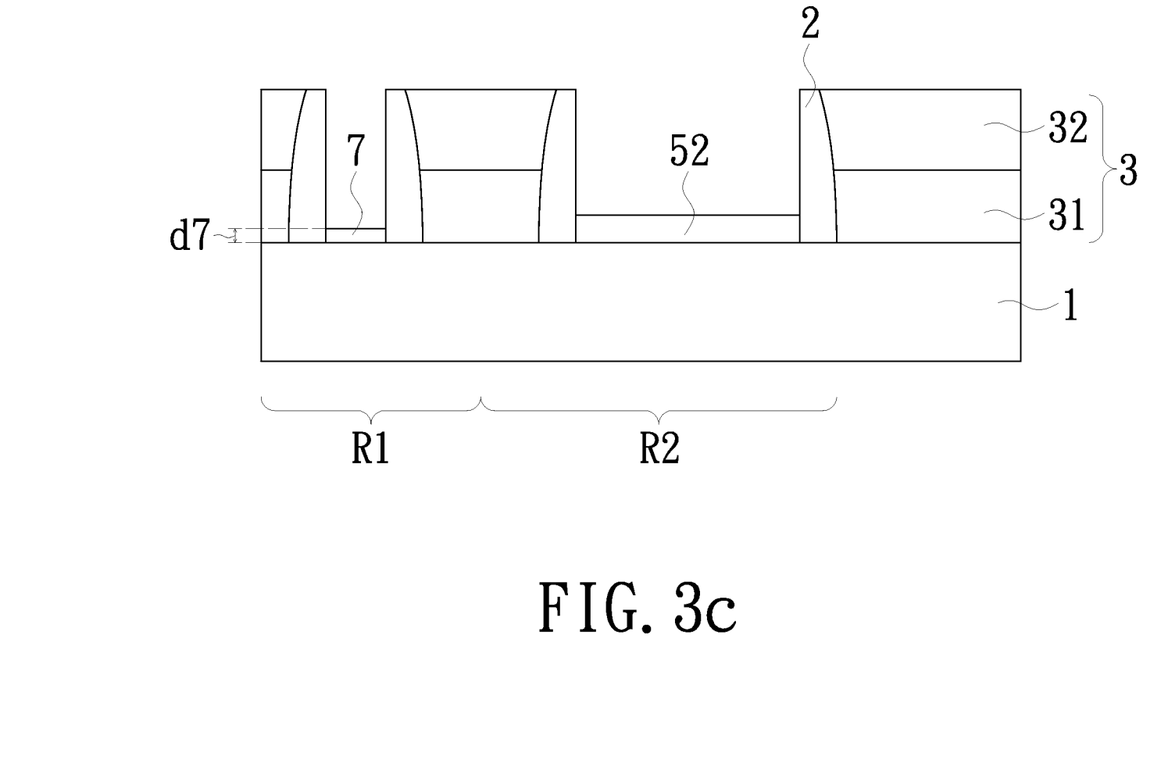
Figure 3D:
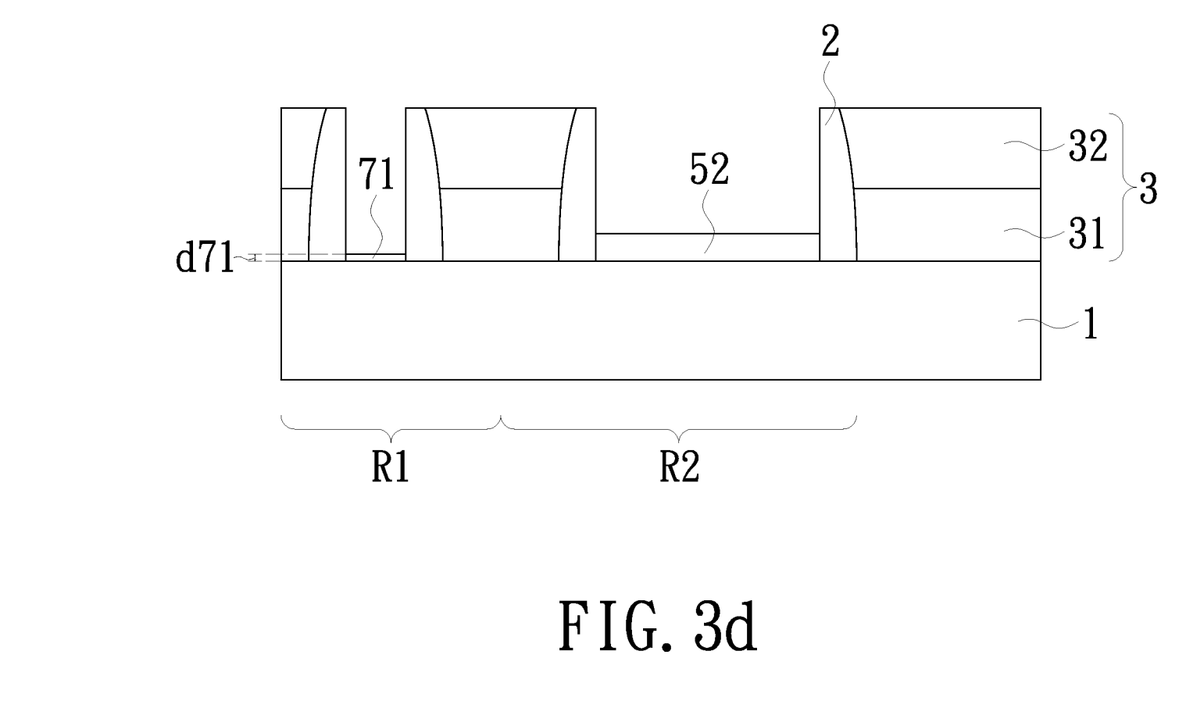

As shown in FIG. 3a, a portion of programmable logic array (PLA) device, before performing the steps as shown in FIG. 2, comprises a core region R1 for main storage, an input/output region (I/O region) R2 for main control, a substrate 1, a trench T1 in the core region R1, a trench T2 in the I/O region R2, a low-k dielectric spacer 2, and a dielectric layer 3, which may comprises a silicon nitride (SiN) layer 31 and an oxide layer 32. However, part of the interfacial oxide layer in the core region R1 requires much lower thickness than the I/O region R2. Thus, as shown in FIG. 2 and FIG. 3a, the step (S9) is performed to form a sacrificial oxide layer on the surface of the substrate 1 in the core region R1. The step (S9) is to form an interfacial oxide layer 5 under about 800-1200 degree Celsius (C) condition on the surface of the substrate 1 with a thickness d5 in a range of 25-45 angstroms in both the trenches T1 and T2 between the low-k dielectric spacers 2 in the core region R1 and the I/O region R2 respectively, wherein the part of the interfacial oxide layer 5 disposed in the trench T1 in the core region R1 becomes a sacrificial oxide layer 51 and the part of the interfacial oxide layer 5 disposed in the trench T2 in the I/O region R2 becomes an I/O oxide layer 52. And then the step (S10) is performed to remove the sacrificial oxide layer 51 from the surface of the substrate 1 in the core region R1. As shown in FIG. 3b, the sacrificial oxide layer 51 in the core region R1 can be removed firstly by forming a mask 6 to cover the I/O oxide layer 52 disposed in the trench T2 in the I/O region R2, and thus the sacrificial oxide layer 51 is exposed and removed by chemical oxide removal method under a temperature in a range of 25-60 degree C., and the chemicals used in the step (S10) can include ozonized pure water (DIO3), diluted hydrogen fluoride (dHF), and other conventional oxide remover. Then the steps (S11)-(S13) are performed to form an interfacial oxide layer 7 in the trench T1 in the core region R1, as shown in FIGS. 2 and 3c. The interfacial oxide layer 7 has a thickness d7 of more than 7 angstroms due to saturation of ozone solution. Then the step (S14) is performed, as shown in FIGS. 2 and 3d, to thin down the thickness of the interfacial oxide layer 7 to form an interfacial oxide layer 71 with a lower thickness d71 than the thickness d7 of the interfacial oxide layer 7. Conditions of the steps (S11)-(S14) shown in FIG. 2 are the same as illustrated above in FIG. 1, and the thickness of the interfacial oxide layer 71 is lower than the thickness of interfacial oxide layer 7 by 1.0-3.5 angstroms. In the step (S14), the I/O oxide layer 52 is also be thinned down by 0.1-1.5 angstroms. The interfacial oxide layer 71 have a thickness d71 in a range of 3.5-6 angstroms, and difference of thickness of the interfacial oxide layer 71 within the entire surface area of the substrate can be controlled in 0.5 angstroms.

The substrate shown in FIGS. 1-2 can be made by silicon or other conductive materials, and the structure of the substrate 1 shown in FIGS. 3a-3d may be a planar wafer, a fin structure or other suitable structures for difference devices.

In one embodiment of the present invention, the interfacial oxide layer formation provided by the present invention is used on a fin structure of a programmable logic array device and follows the steps shown in FIG. 2. Thus, the same FIGS. 3a-3d are used for easier understanding and simpler illustration only but not to limit the present invention, and the element numbers shown in FIGS. 3a-3d stay unchanged to illustrate this embodiment as well. The only difference is the substrate 1 illustrated in the FIG. 2 and FIGS. 3a-3d is now being a fin structure of the substrate in this embodiment. The fin-structured substrate 1 may be made by silicon or germanium containing materials, and the low-k dielectric spacer 2 may be made by silicon carbon nitride (SiCN) or other low-k materials.

In the embodiment shown in FIGS. 2 and 3a, the interfacial oxide layer 5 formed in the step (S9) has a thickness d5 of about 35 angstroms, and the sacrificial oxide layer 51 is removed by chemical oxide removal method in the step (S10). And then, the step (S11) is performed as describe above, the mask 6 is made by photoresist material in this embodiment, and the step (S11) is to use diluted hydrogen fluoride (dHF) for 10 seconds in order to remove possible native oxide formed on the exposed surface of silicon fin structure. Then the step (S12) is performed by SPM solution for 60 seconds in order to form the interfacial oxide layer 7 on the exposed surface of the fin-structured substrate 1 and also to remove the mask 6 as shown in FIGS. 2 and 3c. The step (S13) is performed by using SC1 solution at room temperature as a final cleaning step in order to remove particles possibly attached on the surface of the surface of the interfacial oxide layer 7. The interfacial oxide layer 7 with the thickness d7 of 7.7 angstroms is produced by the end of the step (S13) and difference of thickness of the interfacial oxide layer 7 within the entire surface area of the substrate 1 is 0.47 angstroms. Next, the step (S14) is performed by etching solution comprising diluted hydrogen fluoride (dHF), ozonized pure water (DIO3) and carbon dioxide (CO2) with a hydrogen fluoride (dHF) to ozonized pure water (DIO3) ratio 1 to 5 under room temperature for 20 seconds in order to thin down the interfacial oxide layer 7 for 1.7 angstroms and produce the interfacial oxide layer 71. And difference of thickness of the interfacial oxide layer 71 within the entire surface area of the substrate 1 is reduced to 0.22 angstroms. So in this embodiment, the interfacial oxide layer 71 with the thickness d71 of 6 angstroms is produced with a smoother surface.

In accordance with the aforementioned illustration and embodiments of the present invention, the present invention provides a method of an interfacial oxide layer formation in a semiconductor device. The method can applied in any kind of semiconductor, such as conventional MOSFET and finFET. The present invention provides the method to improve the product performance by thinning down the thickness of the interfacial oxide layer and enhance the stability of the device by improving smoothness of the surface of the interfacial oxide layer without damage to the surface of the substrate underlying the interfacial oxide layer.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method of interfacial oxide layer formation in a semiconductor device, comprising the steps of:

(S01) forming a sacrificial oxide layer in a core region and an input/output region on a surface of a substrate;
(S02) removing the sacrificial oxide layer from the surface of the substrate in the core region;
(S1) removing a native oxide layer from the surface of the substrate;
(S2) forming an interfacial oxide layer on the surface of the substrate by applying piranha solution (SPM);
(S3) cleaning a surface of the interfacial oxide layer by standard clean 1 (SC1); and
(S4) etching the interfacial oxide layer by a solution comprising diluted hydrogen fluoride (dHF) and ozonized pure water (DIO3).

2. The method of interfacial oxide layer formation in the semiconductor device according to claim 1, wherein in the step (S1), the native oxide layer is removed by diluted hydrogen fluoride (dHF).

3. The method of interfacial oxide layer formation in the semiconductor device according to claim 2, wherein the process time of the step (S1) is in a range of 8-12 seconds.

4. The method of interfacial oxide layer formation in the semiconductor device according to claim 1, wherein the process time of the step (S2) is in a range of 50-70 seconds.

5. The method of interfacial oxide layer formation in the semiconductor device according to claim 1, wherein the step (S3) is performed under a temperature below 200 degree C.

6. The method of interfacial oxide layer formation in the semiconductor device according to claim 1, wherein a ratio of diluted hydrogen fluoride (dHF) and ozonized pure water (DIO3) in the step (S4) is in a range of 1:1 to 1:5.

7. The method of interfacial oxide layer formation in the semiconductor device according to claim 6, wherein a ratio of diluted hydrogen fluoride (dHF) and ozonized pure water (DIO3) in the step (S4) is 1:5.

8. The method of interfacial oxide layer formation in the semiconductor device according to claim 1, wherein a concentration of ozonized pure water (DIO3) in the step (S4) is in a range of 2-50 ppm.

9. The method of interfacial oxide layer formation in the semiconductor device according to claim 1, wherein a process time for the step (S4) is in a range of 5-120 seconds.

10. The method of interfacial oxide layer formation in the semiconductor device according to claim 1, wherein a process time for the step (S4) is 20 seconds.

11. The method of interfacial oxide layer formation in the semiconductor device according to claim 1, wherein a thickness of the interfacial oxide layer after the step (S4) is thinner than a thickness of the interfacial oxide layer after the step (S3) by 1.0-3.5 angstroms.

12. The method of interfacial oxide layer formation in the semiconductor device according to claim 1, wherein a thickness of the interfacial oxide layer after the step (S4) is 3.5-6.0 angstroms.

13. The method of interfacial oxide layer formation in the semiconductor device according to claim 1, wherein the step (S01) is performed under a temperature within a range of 800-1200 degree C.

14. The method of interfacial oxide layer formation in the semiconductor device according to claim 1, wherein the step (S02) is performed under a temperature within a range of 25-60 degree C.

15. The method of interfacial oxide layer formation in the semiconductor device according to claim 1, between the step (S01) and step (S02), further comprises following step:
(S011) forming a mask covering the sacrificial oxide layer in the input/output region.

16. The method of interfacial oxide layer formation in the semiconductor device according to claim 15, wherein the mask is removed in the step (S2) by piranha solution (SPM).

17. The method of interfacial oxide layer formation in the semiconductor device according to claim 16, wherein the sacrificial oxide layer in the input/output region is thinned down by 0.1~1.5 angstroms in the step (S2).

18. A method of interfacial oxide layer formation in a semiconductor device, comprising the steps of:
- (S1) removing a native oxide layer from a surface of a substrate;
- (S2) forming an interfacial oxide layer on the surface of the substrate by applying piranha solution (SPM);
- (S3) cleaning a surface of the interfacial oxide layer by standard clean 1 (SC1); and
- (S4) etching the interfacial oxide layer by a solution comprising diluted hydrogen fluoride (dHF) and ozonized pure water (DIO3),
- wherein a difference of thicknesses of the interfacial oxide layer after the step (S4) within an entire surface area of the substrate is within 0.5 angstroms.

\* \* \* \* \*